US006198167B1

(12) United States Patent
Economikos et al.

(10) Patent No.: US 6,198,167 B1
(45) Date of Patent: Mar. 6, 2001

(54) SEMICONDUCTOR STRUCTURE EXHIBITING REDUCED CONTACT RESISTANCE AND METHOD FOR FABRICATION

(75) Inventors: Laertis Economikos, Wappingers Falls; Johnathan Faltermeier, LaGrange; Byeongju Park, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/301,567

(22) Filed: Apr. 29, 1999

(51) Int. Cl.$^7$ .................................................. H01L 23/48
(52) U.S. Cl. ........................................... 257/741; 257/754
(58) Field of Search ................................... 257/754, 757, 257/773, 741

(56) References Cited

U.S. PATENT DOCUMENTS 5,773,891 * 6/1998 Delgado et al. ..................... 257/754

OTHER PUBLICATIONS

Thakur et al, Novel Method for Deposition of in situ Arsenic–Doped Polycrystalline Silicon Using Conventional Low Pressure Chemical Vapor Deposition Systems, *Appl. Phys. Lett.* 65 (22), Nov. 28, 1994: 2809–2811.

Drynan et al, Fabrication of Polysilicon Plugs for Deep–Submicron Contact–Holes, *VMIC Conference*, Jun. 12–13, 1990: 441–443.

* cited by examiner

*Primary Examiner*—Roy Potter
(74) *Attorney, Agent, or Firm*—Pollock, Vande Sande & Amernick; Steven Capella

(57) ABSTRACT

A semiconductor structure of reduced contact resistance is provided by providing a layer of amorphous silicon-derived material on an epitaxial silicon substrate having an average dopant concentration of at least about $10^{20}$ atoms/cm$^3$ in the contact material within about 500 Å of the substrate.

12 Claims, 1 Drawing Sheet

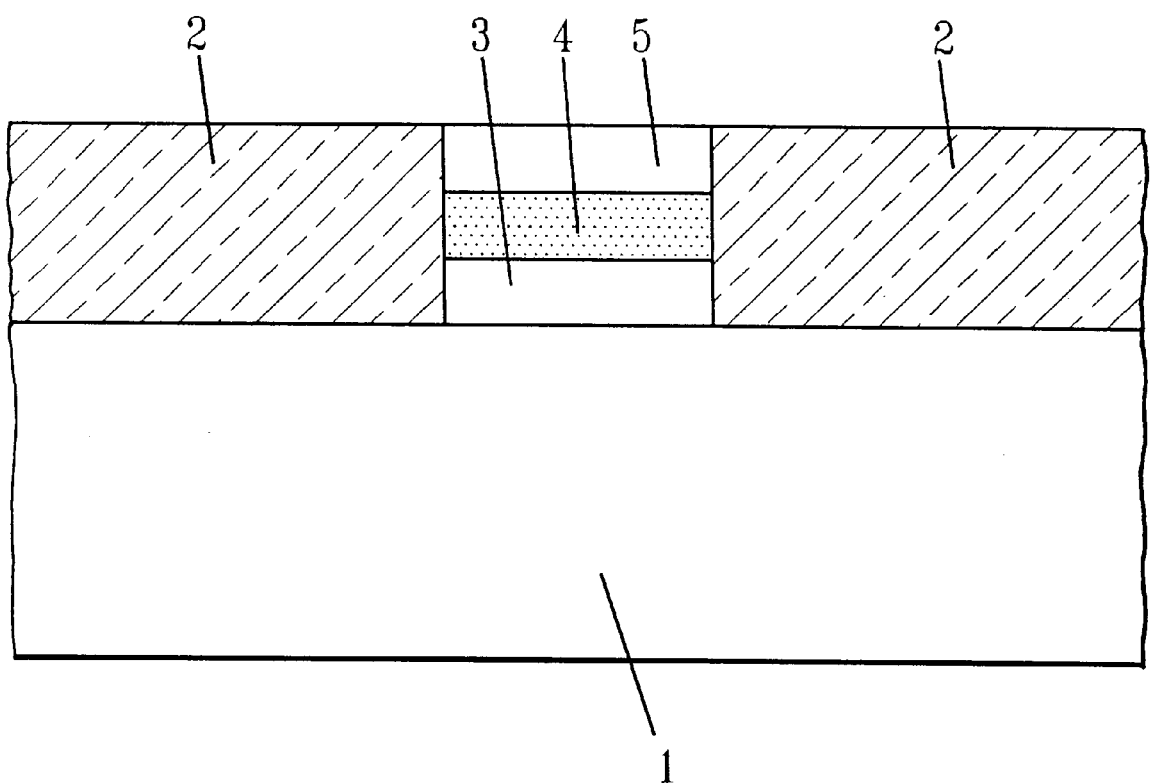

SEMICONDUCTOR STRUCTURE EXHIBITING REDUCED CONTACT RESISTANCE AND METHOD FOR FABRICATION

TECHNICAL FIELD

The present invention relates to semiconductor structures that exhibit reduced contact resistance and especially those structures containing polycrystalline silicon interconnection plug or stud to an epitaxial monocrystalline silicon substrate. In addition, the present invention is concerned with a method for fabricating a semiconductor structure which exhibits reduced contact resistance.

BACKGROUND OF INVENTION

Polycrystalline silicon and particularly in-situ doped polycrystalline silicon has been suggested as a contact material especially for ultralarge scale integration technology. Doped polycrystalline silicon has been suggested as a suitable plug or stud material (for a contact-hole or via) that makes contact with an underlying epitaxial monocrystalline silicon substrate. The silicon can be co-deposited on the desired substrate along with the dopant by chemical vapor deposition process. It has been reported that relatively deep-submicron contact holes have been successfully plugged with polysilicon.

Continuing efforts have been underway for providing improved methods for depositing doped polycrystalline silicon especially for improving the deposition rates and controlling radial non-uniformity across the wafer that has been caused by adding the dopant gas. Notwithstanding the strides that have been made, room still exists for improvement. This is especially so with respect to attempting to further reduce the contact resistance.

For instance, in-situ phosphorus-doped polycrystalline silicon exhibits contact resistance of about two-three times lower than a polycrystalline silicon doped after deposition with phosphorus. However, in-situ doping of phosphorus and boron requires fine-tuning of the dopant injection system and obtaining uniform in-situ doping is problematic. The problem of uniformity becomes significantly more acute when attempting to carry out in-situ doping of arsenic. Arsenic is a very desirable dopant because of its low diffusivity. This uniformity problem has been addressed to some extent by employing furnaces having loadlocks and a relatively complex array of injectors.

Furthermore, the deposition rate decreases considerably during phosphorus in-situ doping or arsenic in-situ doping.

Accordingly, providing an improved technique for achieving reduced contact resistance would be desirable.

SUMMARY OF INVENTION

The present invention makes it possible to provide for reduced contact resistance. The present invention makes it possible to achieve reduced contact resistance employing conventional furnaces for doping without requiring loadlocks or a complex array of injectors. In addition, the present invention makes it possible to achieve uniform doping with any conventional dopant including phosphorus, boron and even arsenic.

In one aspect, the invention encompasses a semiconductor structure exhibiting reduced contact resistance. The structure comprises an epitaxial monocrystalline silicon substrate, an insulator layer over the epitaxial monocrystalline silicon substrate, a via etched through the insulator layer to the epitaxial monocrystalline silicon substrate in a limited area, and a contact material in the via in contact with the epitaxial monocrystalline silicon substrate, the 500 Å of the contact material closest to the epitaxial monocrystalline silicon substrate being an amorphous silicon-derived material having an average dopant concentration of at least about $10^{20}$ dopant atoms per $cm^3$. The 500 Å portion of the contact may contain layers of undoped amorphous silicon derived material alternating with doping layers, such that the doping layers are separated by undoped amorphous silicon-derived layers.

In another aspect, the invention encompasses a method for fabricating a semiconductor structure having reduced contact resistance. The method of the invention comprises depositing by chemical vapor deposition onto an exposed epitaxial monocrystalline silicon substrate contact surface, layers of undoped amorphous silicon interspersed with dopant layers which are formed by flowing a dopant chemical species over one or more of the deposited amorphous silicon layers. The methods of the invention preferably provide a doped layer of amorphous silicon-derived material having an average bulk dopant concentration of at least about $10^{20}$ atoms/$cm^3$ within the first 500 Å thickness.

These and other aspects of the invention are described in further detail below.

SUMMARY OF DRAWING

The FIGURE is a schematic representation of a structure according to the present invention.

DETAILED DESCRIPTION OF THE INVENTION

The invention provides for contact structures having reduced contact resistance. According to the present invention, the contact resistance can be controlled by the doping level employed within the vicinity of the contact interface in combination with the deposition of substantially amorphous silicon for the portion of the electrical contact closest to the contact interface.

The processes of the invention enable acheivement of low contact resistance, even using the older types of furnaces without loadlocks, complex injectors or other costly apparatus. Moreover, the process of the present invention enables the achievement of uniform doping with dopants such as arsenic using conventional apparatus.

The processes of the invention are generally characterized by the following steps:

(a) providing a substrate having an insulator layer over an epitaxial silicon layer, the insulator layer having one or more through-holes (vias) whereby a portion of the epitaxial silicon surface is exposed, (b) depositing an amorphous silicon material layer on said exposed surface, and (c) depositing a dopant species on the amorphous silicon layer.

Steps (b)–(c) may be sufficient to establish a thickness of 500 Å of contact material measured from and normal to the epitaxial silicon surface. Alternatively, steps (b) and (c) may be repeated to build a contact thickness of at least 500 Å or to build contact thickness beyond 500 Å. The method preferably includes one or more additional steps to deposit additional contact material beyond the 500 Å thickness whereby a contract structure is established which substantially fills the through-hole (via). Reference to the figure schematically illustrates a structure according to the present invention, whereby 1 represents the epitaxial silicon surface and 2 represents an insulator such as $SiO_2$. Numeral 3 illustrates the dopant layer within 500 angstroms of substrate 1. Numeral 4 is a layer of amorphous silicon-derived contact material and numeral 5 is a metal layer.

The structure provided in step (a) may be formed using any technique known in the art. Typically, the insulator would be a silica ($SiO_2$) layer which is deposited over the epitaxial silicon surface. The desired through-holes or vias may then be formed using a conventional photolithographic technique. The invention is not limited to any particular method of providing the structure in step (a).

Amorphous silicon is preferably deposited in step (b) using a conventional low pressure chemical vapor deposition furnace. The silicon precursor is preferably a silicon-containing gas such as silane or silylene. The silicon deposition preferably results in an amorphous silicon deposit having a thickness of about 20 to 500 Å, more preferably about 50 to 200 Å. The silicon deposition temperature is preferably about 500° C. to 560° C., more preferably about 525° C. to 550° C. Temperatures exceeding 560° C. may result in the deposition of polycrystalline silicon. The range for the total pressure, which includes the partial pressure of the balance gases, if used, for the deposition is preferably about 10 mTorr to 10 Torr, more preferably about 100 mTorr to 600 mTorr. The layers of amorphous silicon are preferably at least about 90% amorphous silicon, more preferably at least about 95% amorphous silicon and most preferably as close to 100% amorphous silicon as possible.

The dopant is deposited in step (b) preferably by chemical vapor deposition. The dopant specifies is preferably selected from the group consisting of boron, phosphorous, arsenic, aluminum, gallium, indium or antimony, or combinations thereof with boron, phosphorus, arsenic and combinations thereof being most preferred. The dopant is preferably deposited by chemical vapor deposition from a precursor reactant species (such as $BH_3$, $B_2H_6$, $PH_3$ or $AsH_3$). As with the amorphous silicon deposition, the dopant is preferably deposited at a temperature of about 500° C. to 560° C., more preferably about 525° C. to 550° C. and at a total pressure (including the partial pressure of the balance gases, if used) of about 10 mTorr to 10 Torr, more preferably about 100 mTorr to 600 mTorr.

Alternatively, other doping methods may be employed if desired.

The deposition of amorphous silicon and layered doping may be repeated until a desired number of doping layers is formed within the first 500 Å from the surface of the initial surface before any deposition. The dopant layers are preferably sandwiched between the amorphous silicon layers. Preferably, the material deposited in direct contact with the epitaxial silicon surface is amorphous silicon. Thus, the first dopant layer is preferably spaced apart from the epitaxial silicon substrate surface. Although the dopant can be deposited directly at the exposed epitaxial silicon surface, the incorporation of the dopant is only about 1/10 as effective on epitaxial silicon as on amorphous silicon in the normal amorphous silicon processing temperature range so that some deposition of amorphous silicon before the first dopant deposition is preferred. Otherwise, the exact sequence and number of dopant and amorphous silicon layers may be varied so long as sufficient average dopant concentration is achieved within the first 500 Å of contact material. Typically, about 1 to 5 layers of doping are needed to achieve an average bulk doping concentration between $10^{20}$ atoms/cm$^3$ and $6 \times 10^{20}$ atoms/cm$^3$ over the first 500 Å of material.

The total thickness of the amorphous silicon layer(s) and doping layer(s) deposition may exceed 500 Å, e.g., even to the point of completely filling the via. Alternatively, if desired, the deposition deposition beyond the initial 500 Å thickness can be conducted by depositing polycrystalline silicon employing temperatures of greater than about 560° C. and typically temperatures of about 565° C. to about 650° C. at the cost of some increase in the contact resistance but reducing the processing time.

Examples of suitable dopant deposition conditions are indicated below. As an example of phosphorus doping, the deposition may be conducted at 50 mTorr partial pressure of $PH_3$ at 550° C., for 10 to 30 minutes resulting in about $10^{15}$ atoms/cm$^2$ of doping which, if spread over 500 Å thickness, results in an average bulk doping concentration of about $2 \times 10^{20}$ atoms/cm$^3$. As an example of arsenic doping, the deposition may be conducted at 0.9 mTorr partial pressure of $AsH_3$ at 550° C., for about 20 minutes resulting in about $6 \times 10^{14}$ atoms/cm$^2$ of doping which, if spread over 500 Å thickness, results in an average bulk doping concentration of about $1.2 \times 10^{20}$ atoms/cm$^3$. The self-limiting nature of the dopant deposition, or dopant adsorption, offers good processing stability, within batch uniformity, and within wafer uniformity.

Subsequent to the deposition, the structure is typically subjected to a high temperature thermal anneal which would convert amorphous silicon to polycrystalline silicon. The grain size of the crystallized amorphous silicon will typically by larger than that of conventionally deposited polycrystalline silicon. The anneal is typically carried out at temperatures of about 800° C. to 950° C.

The contact can then be completed by providing a layer of a metal which is compatible with the polysilicon on top of the polysilicon. Any typical back end of the line (BEOL) conductor can be used such as tungsten, copper, aluminum, titanium or tantalum. In the event the metal is not compatible with silicon, then a suitable metallic liner can be provided between the metal and the silicon plug.

The following non-limiting examples are presented to further illustrate the present invention. For measurement of contact resistance, the examples employed DRAM memory devices. Sheet resistance data was obtained from the films deposited on the monitor wafers. Two types of monitor wafers, 1000 Å thermal oxide wafers and bare silicon wafers, were used in the testing. Each type of wafer was used for each of the examples below.

COMPARISON EXAMPLE 0

The silicon was deposited employing the following conditions:

deposition and doping temperature: 620° C.

deposition pressure and gas: 200 mTorr, 100% $SiH_4$ doping gas: 500 mTorr, 10% $PH_3$ in He balance gas doping performed at film thickness of: 200 Å, 400 Å total phosphorus dose on monitor wafers: about $2.0 \times 10^{15}$ atoms/cm$^2$

EXAMPLE 1

The silicon was deposited employing the following conditions:

deposition and doping temperature: 550° C.

deposition pressure and gas: 200 mTorr, 100% $SiH_4$ doping gas: 500 mTorr, 10% $PH_3$ in He balance gas doping performed at film thickness of: 0 Å, 100 Å, 200 Å, 500 Å, 800 Å, and 1900 Å total phosphorus dose on monitor wafers: about $4.6 \times 10^{15}$ atoms/cm$^2$.

EXAMPLE 2

The silicon was deposited employing the following conditions:
deposition and doping temperature: 550° C.
deposition pressure and gas: 200 mTorr, 100% SiH$_4$
doping gas: 500 mTorr, 10% PH$_3$ in He balance gas
doping performed at film thicknesses of: 100 Å, 200 Å, 500 Å, 800 Å, and 1900 Å
total phosphoros dose on monitor wafers: $4.5 \times 10^{15}$ atoms/cm$^2$.

COMPARISON EXAMPLE 3

The silicon was deposited employing the following conditions:
deposition and doping temperature: 550° C.
deposition pressure and gas: 200 mTorr, 100% SiH$_4$
doping gas: 500 mTorr, 10% PH$_3$ in He balance gas
doping performed at film thickness of: 0 Å, 500 Å, 1000 Å, 1500 Å, 2000 Å, and 2500 Å
total phosphorus dose on monitor wafers: $5.1 \times 10^{15}$ atoms/cm$^2$.

COMPARISON EXAMPLE 4

The silicon was deposited employing the following conditions:
deposition and doping temperature: 550° C.
deposition pressure and gas: 200 mTorr, 100% SiH$_4$
doping gas: 500 mTorr, 10% PH$_3$ in He balance gas
doping performed at film thickness of: 500 Å, 1000 Å, 1500 Å, 2000 Å, and 2500 Å
total phosphorus dose on monitor wafers: about $5.0 \times 10^{15}$ atoms/cm$^2$.

EXAMPLE 5

The silicon was deposited employing the following conditions:
deposition and doping temperature: 550° C.
deposition pressure and gas: 200 mTorr, 100% SiH$_4$
doping gas: 500 mTorr, 10% PH$_3$ in He balance gas
doping performed at film thickness of: 200 Å, 400 Å
total phosphorus dose on monitor wafers: $2.1 \times 10^{15}$ atoms/cm$^2$.

COMPARISON EXAMPLE 6

The silicon was deposited employing the following conditions:
deposition and doping temperature: 580° C.
deposition pressure and gas: 200 mTorr, 100% SiH$_4$
doping gas: 500 mTorr, 10% PH$_3$ in He balance gas
doping performed at film thickness of: 100 Å, 200 Å, 500 Å, 800 Å, 1900 Å
total phosphorus dose on monitor wafers: $5.2 \times 10^{15}$ atoms/cm$^2$.

COMPARISON EXAMPLE 7

The silicon was deposited employing the following conditions:
deposition and doping temperature: 580° C.
deposition pressure and gas: 200 mTorr, 100% SiH$_4$
doping gas: 500 mTorr, 10% PH$_3$ in He balance gas
doping performed at film thickness of: 500 Å, 1000 Å, 1500 Å, 2000 Å, and 2500 Å
total phosphorus dose on monitor wafers: about $5.2 \times 10^{15}$ atoms/cm$^2$.

In addition to the above conditions, the sheet resistance ($R_s$) monitor wafers were subsequently capped with TEOS oxide to prevent the loss of the dopants, and thermal annealed at 800° C. for 10 minutes. 49 $R_s$ point measurements were performed on the monitor wafers. The results are reported in Table 1 below.

In all of the above examples, 17 modules were tested per device wafer for contact resistance ($R_c$). The results for contact resistance are reported in Table 2 below.

TABLE 1

| Example | substrate type | Thickness (Å) | Rs mean (Ohms/sq) | Rs min (Ohms/sq) | Rs max (Ohms/sq) |
|---|---|---|---|---|---|
| Comparison 0 | 1000A thermal oxide | 3,025 | 2,609 | 2,527 | 2,683 |
| 1 | 1000A thermal oxide | 3,200 | 71.8 | 68.8 | 74.5 |
| 2 | 1000A thermal oxide | 3,030 | 90.1 | 85.3 | 93.9 |
| Comparison 3 | 1000A thermal oxide | 3,055 | 50 | 47.8 | 51.7 |
| Comparison 4 | 1000A thermal oxide | 2,992 | 51.7 | 49.7 | 53.3 |
| 5 | 1000A thermal oxide | 2,990 | 270.3 | 198.2 | 311 |
| Comparison 6 | 1000A thermal oxide | 3,530 | 435.9 | 393.1 | 468.6 |
| Comparison 7 | 1000A thermal oxide | 3,510 | 203.4 | 182.9 | 218.7 |
| Comparison 0 | p-silicon | 3,025 | 2,234 | 2,185 | 2,285 |
| 1 | p-silicon | 3,200 | 68 | 65.9 | 70.6 |
| 2 | p-silicon | 3,030 | 81.8 | 77.6 | 85.4 |
| Comparison 3 | p-silicon | 3,055 | 46.3 | 45.1 | 47.7 |
| Comparison 4 | p-silicon | 2,992 | 48.2 | 47.1 | 49.1 |
| 5 | p-silicon | 2,990 | 238.1 | 191.3 | 298.5 |
| Comparison 6 | p-silicon | 3,530 | 432 | 388.6 | 466.6 |
| Comparison 7 | p-silicon | 3,510 | 181.7 | 165.1 | 196.7 |

TABLE 2

| Example | substrate | Rc median (Ohms) | Rc min (Ohms) | Rc max (Ohms) |
|---|---|---|---|---|
| Comparison 0 | device wafers | 4,525 | 3,825 | 5,275 |
| 1 | device wafers | 1,417 | 1,267 | 3,407 |
| 2 | device wafers | 1,657 | 1,403 | 4,640 |
| Comparison 3 | device wafers | 6,280 | 4,630 | 12,950 |
| Comparison 4 | device wafers | 9,385 | 6,295 | 16,400 |
| 5 | device wafers | 1,693 | 1,410 | 3,463 |
| Comparison 6 | device wafers | 7,033 | 5,277 | 15,600 |
| Comparison 7 | device wafers | 17,900 | 12,600 | 37,000 |

SIMS profiles were obtained from unannealed bare silicon monitor wafers (right after deposition) and from bare silicon monitors annealed at 800° C. for 10 minutes (to mimic the dopant redistribution according to the typical process flow).

A comparison of unannealed and annealed films demonstrates that the dopants do move slightly but that they never get distributed uniformly. In other words, the films retain the initial doping profile to a significant degree even after anneal. The initial doping profile remains a significant factor in determining the contact resistance.

While the disclosure shows and describes the preferred embodiments of the invention, it is to be understood that the invention is capable of use in various other combinations, modifications, and environments and is capable of changes or modifications within the scope of the inventive concept as expressed herein, commensurate with the above teachings and/or the skill or knowledge of the relevant art.

What is claimed is:

1. A semiconductor structure exhibiting reduced contact resistance which comprises an epitaxial monocrystalline silicon substrate and a contact structure contacting said substrate, said contact structure comprising (a) at least one layer of amorphous silicon-derived contact material, and (b) at least one layer of amorphous silicon-derived contact material comprising dopant, the contact structure having an average dopant concentration within 500 Å of said substrate of at least about $10^{20}$ dopant atoms/cm3.

2. The semiconductor structure of claim 1 wherein said dopant layer is located within about 200 Å or less of the silicon substrate.

3. The semiconductor structure of claim 1 wherein said dopant layer is located at least about 20 Å from the silicon substrate.

4. The semiconductor structure of claim 1 wherein the said dopant layer is at least about 50 Å from the silicon substrate.

5. The semiconductor structure of claim 1 wherein said contact comprises 1 to 5 dopant layers located about 50 Å to 500 Å from the silicon substrate.

6. The semiconductor structure of claim 5 wherein said 1 to 5 dopant layers are located about 50 Å to 200 Å from the silicon substrate.

7. The semiconductor structure of claim 1 wherein the average dopant concentration is about $10^{20}$ to $6\times10^{20}$ atoms/cm$^3$.

8. The semiconductor structure of claim 1 wherein the dopant is at least one member selected from the group consisting of boron, phosphorous, arsenic, aluminum, gallium, indium and antimony.

9. The semiconductor of claim 1 wherein the dopant is at least one member selected from the group consisting of boron, phosphorus and arsenic.

10. The semiconductor structure of claim 1 wherein the dopant is phosphorus.

11. The semiconductor structure of claim 1 which further comprises polycrystalline silicon or amorphous silicon-derived silicon located greater than 500 Å from said substrate.

12. The semiconductor structure of claim 11 which further comprises a metal in contact with said polycrystalline silicon or amorphous silicon-derived silicon.

* * * * *

UNITED STATES PATENT AND TRADEMARK OFFICE
CERTIFICATE OF CORRECTION

PATENT NO.   : 6,198,167 B1
DATED        : March 6, 2001
INVENTOR(S)  : Laertis Economikos et al.

It is certified that error appears in the above-identified patent and that said Letters Patent is hereby corrected as shown below:

Column 7,
Line 23, "atoms/cm3" should be -- atoms/cm$^3$ --.

Signed and Sealed this

Twenty-seventh Day of November, 2001

Attest:

NICHOLAS P. GODICI
Attesting Officer   Acting Director of the United States Patent and Trademark Office